United States Patent [19]
Taruya

[11] Patent Number: 5,296,999
[45] Date of Patent: Mar. 22, 1994

[54] IGNITER ASSEMBLY

[75] Inventor: Masaaki Taruya, Himeji, Japan

[73] Assignee: Mitsubishi Denki Kabushiki Kaisha, Tokyo, Japan

[21] Appl. No.: 41,344

[22] Filed: Apr. 1, 1993

Related U.S. Application Data

[63] Continuation of Ser. No. 699,107, May 13, 1991, abandoned.

[30] Foreign Application Priority Data

May 16, 1990 [JP] Japan .................... 2-124216

[51] Int. Cl.⁵ .................................... F02P 3/00
[52] U.S. Cl. ............................... 361/247; 123/647
[58] Field of Search ........... 361/247, 248, 253, 382, 361/392, 394, 405, 406, 408, 413; 123/635, 647

[56] References Cited

U.S. PATENT DOCUMENTS

| | | | |
|---|---|---|---|
| 4,032,706 | 6/1977 | Paletto | 174/52 PE |
| 4,369,330 | 1/1983 | Pilz | 174/52 FP |
| 4,448,265 | 5/1984 | Kodal et al. | 174/52 PE |
| 5,044,328 | 9/1991 | Umezaki | 123/647 |
| 5,191,827 | 3/1993 | Takaishi | 123/647 |

FOREIGN PATENT DOCUMENTS

| | | |
|---|---|---|
| 2823666 | 12/1979 | Fed. Rep. of Germany ...... 361/382 |
| 165584 | 12/1980 | Japan . |
| 166389 | 10/1982 | Japan . |
| 63-75356 | 4/1988 | Japan . |
| 248598 | 10/1989 | Japan . |
| 2-27164 | 1/1990 | Japan . |

Primary Examiner—Jeffrey A. Gaffin
Attorney, Agent, or Firm—Sughrue, Mion, Zinn, Macpeak and Seas

[57] ABSTRACT

An igniter assembly is provided for controlling the current supply to an ignition coil of an engine. The assembly reduces soldering and assembly steps thereby resulting in reduced manufacturing costs. In one embodiment, the igniter includes a casing, an electronic circuit unit, a connector attached to the casing, and a connector terminal within the connector one end of the terminal being directly connected to the electronic circuit unit. In another embodiment, the igniter includes an electronic circuit unit, a connector terminal directly connected to the electronic circuit unit, and a molded body forming an integral casing and connector supporting and enclosing the electronic circuit and connector terminal respectively.

4 Claims, 2 Drawing Sheets

IGNITER ASSEMBLY

This is a continuation of application Ser. No. 07/699,107 filed May 13, 1991, now abandoned.

BACKGROUND OF THE INVENTION

The present invention relates to an igniter assembly for controlling the current supply to a primary winding of an ignition coil of an internal combustion engine.

An example of a known igniter assembly is illustrated in FIGS. 4 and 5. The illustrated assembly includes a casing 1, an electronic circuit unit 2 in the form of a power transistor housed in the casing 1, a connector 3 attached to the casing 1, a plurality of connector terminals 4, a plurality of connecting leads 5 having opposite ends which are soldered 6 to the connector terminal 4 and the power transistor unit 2 respectively, for providing electrical connection therebetween, and a cover 7 for covering an opening formed in the casing 1. The connector 3 is adapted to be connected to an ignition coil for providing electrical connection between an unillustrated ignition coil and the electronic circuit unit 2 through the connector terminals 4, so that the electronic circuit unit 2 controls the current supply to a primary winding of the ignition coil which has a secondary winding connected through a distributor to unillustrated ignition plugs for cylinders of an engine.

The conventional assembly is constructed as follows. First, the power transistor unit 2 is inserted in the casing 1 to which the connector 3 is then attached. In this connection, the connector 3 may be attached to the casing 1 in advance before the power transistor unit 2 is placed in the casing 1. Thereafter, one end of each connecting lead 5 is soldered to the connector terminal 4, and the other end thereof to the power transistor unit 2. After the soldering of the connecting leads 5, the cover 7 is secured to the casing 1 for covering the opening therein.

In operation, when a control signal is supplied to the power transistor unit 2, the unit 2 controls, based on the control signal, the current supply to a primary winding of an unillustrated ignition coil, which is adapted to be connected to the connector 3, so that a high voltage will be developed across a secondary winding thereof based on the current supplied to the primary winding. The high voltage thus developed is then fed through an unillustrated distributor to spark plugs (not shown) for firing the cylinders of an engine.

With the conventional igniter assembly as constructed above, connecting leads 5 are required for providing connection between the connector terminals 4 and the power transistor unit 2 and, furthermore, the leads must be connected at opposite ends thereof to the terminals 4 and transistor 2, respectively, by a solder 6, resulting in an increase in assembly steps and adding to the cost of manufacture.

SUMMARY OF THE INVENTION

Accordingly, the present invention is intended to obviate the above-described problems encountered with the conventional igniter assembly.

An object of the invention is to provide a novel and improved igniter, of the kind described, requiring less soldering thereby reducing the steps necessary for assembly as well as reducing manufacturing.

In order to achieve the above objectives, according to the present invention, there is provided an igniter assembly having:

a casing,
an electronic circuit unit,
a connector attached to the casing, and
a connector terminal within the connector and having one end in direct contact with the electronic.

According to another aspect of the invention, there is provided an igniter comprising, an electronic circuit unit,
a connector terminal directly connected to the electronic circuit unit, and
a molded body having a casing and a connector integrally formed, the casing and connector enclosing the electronic circuit and the connector terminal respectively.

The above and other objectives, features and advantages of the invention will be more readily apparent from the following detailed description of the preferred embodiments of the invention taken in conjunction with the accompanying drawings.

DESCRIPTION OF PREFERRED EMBODIMENTS

The preferred embodiments of the present invention will now be described in detail while referring to the accompanying drawings.

Figure 1:
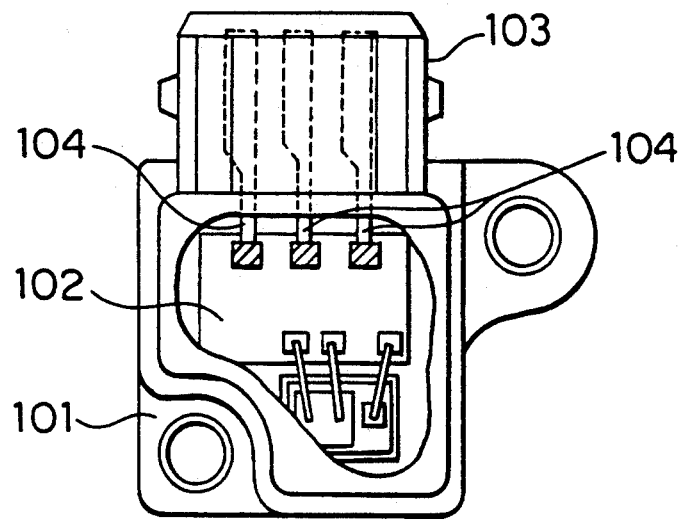
FIG. 1 is a partially cut-away front elevation view of an igniter in accordance with the present invention.
Figure 2:
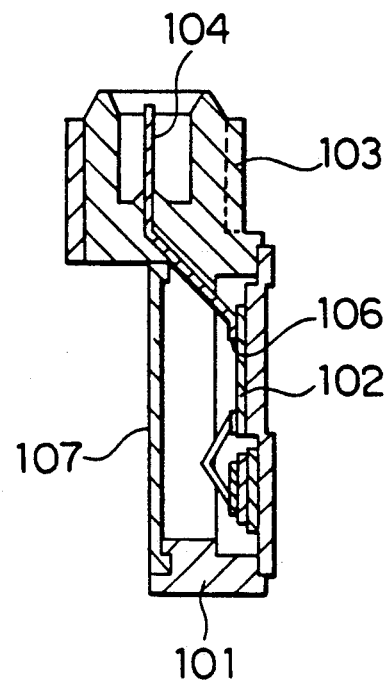
FIG. 2 is a vertical section of the igniter of FIG. 1.

Referring to FIGS. 1 and 2, there is shown an igniter constructed in accordance with a first embodiment of the invention. The igniter of this embodiment includes a casing 101, an electronic circuit unit 102 in the form of a power transistor unit, a connector 103 attached to the casing 101, a plurality of connector terminals 104, and a cover 107 for covering an opening formed in the casing 101. The connector terminals 104 have their one end directly connected as by soldering 106 to the power transistor unit 102 which is embedded in the connector 103.

Figure 4:
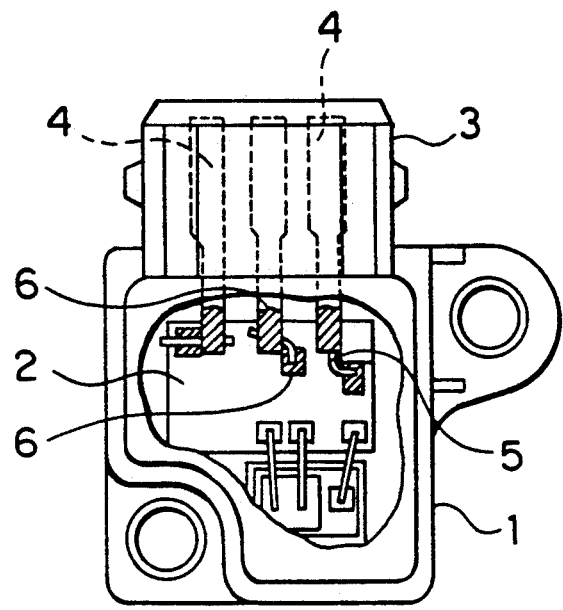
FIG. 4 is a view similar to FIG. 1, but showing a known igniter.
Figure 5:
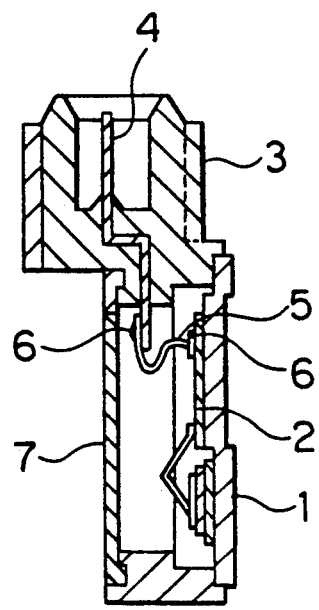
FIG. 5 is a vertical section of the known igniter of FIG. 4.

Accordingly, the connection of leads 5, as shown in the conventional igniter of FIGS. 4 and 5, are no longer necessary and, therefore, there is no need to solder the connecting leads 5 at opposite ends thereof. As a result, the number of assembly steps is greatly reduced, thus simplifying the assembly and improving the efficiency thereof.

Figure 3:
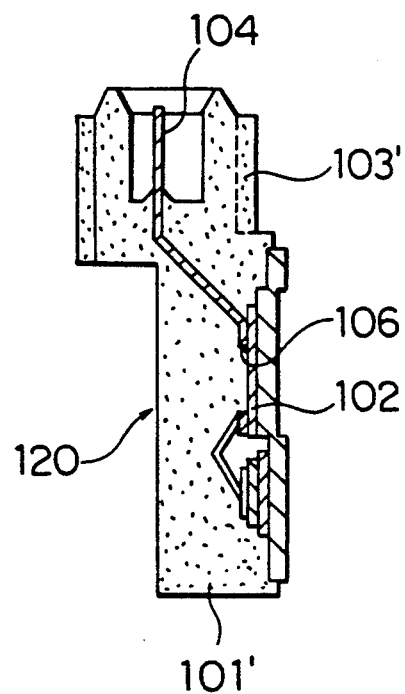
FIG. 3 is a view similar to FIG. 3, but showing another embodiment of the invention.

FIG. 3 shows another embodiment of the invention. In this embodiment, a power transistor unit 102 together with connector terminals 104 is integrally packaged by a molded body 120, which has a casing 101' and a connector 103' integrally formed with each other. With the above described igniter construction it is possible to form an igniter using integral molding techniques. This leads to further improvements in productivity and manufacturing costs, omitting troublesome assembly of the casing 101 and the connector 103, the assembly of the cover 107 to the casing 101, as well as soldering of the connector terminal 104 to the power transistor unit 102. The molded body 120 may further be formed from an electrically insulating and heat resistant material.

Although, in the above described embodiments, the electronic circuit unit 102 takes the form of a power transistor unit, it is of course not limited to this but can be another type of electronic circuit element.

What is claimed is:

1. An igniter assembly comprising:
   a casing;
   an electronic circuit unit supported by and enclosed within said casing;
   an electrical connector housing fixedly attached to said casing; and
   a plurality of connector terminals electrically insulated and separated from each other and being supported by and partially enclosed within said electrical connector housing so that, when said connector housing is attached to said casing, one end of each connector terminal can be placed in direct contact with said electronic circuit unit.

2. An igniter assembly comprising:
   an electronic circuit unit;
   a plurality of connector terminals, one end of each of said terminals being positioned in direct contact with said electronic circuit unit;
   a molded body for separating and electrically insulating the connector terminals from each other, said molded body completely enclosing said electronic circuit unit; and
   an electrical connector housing, integrally molded with said molded body, through which said plurality of connectors protrude.

3. An igniter according to claim 2, wherein said molded body is formed from an electrically insulating and heat-resistant material.

4. An igniter assembly comprising:
   an electronic circuit unit;
   a plurality of connector terminals; and
   a molded body having a connector portion and a casing portion, said molded body supporting and electrically insulating said connector terminals from one another, wherein one end of each connector terminal at said casing portion of said molded body is in direct contact with the electronic circuit unit, and an opposite end of each connector terminal protrudes through said connector portion of said molded body, said electronic circuit unit being completely enclosed by said casing portion of said molded body.

* * * * *